United States Patent
Yuguchi et al.

(10) Patent No.: US 10,950,522 B2
(45) Date of Patent: Mar. 16, 2021

(54) ELECTRONIC DEVICE

(71) Applicant: SHINDENGEN ELECTRIC MANUFACTURING CO., LTD., Tokyo (JP)

(72) Inventors: Junya Yuguchi, Hanno (JP); Kousuke Ikeda, Hanno (JP); Kenichi Suzuki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 379 days.

(21) Appl. No.: 15/763,055

(22) PCT Filed: Feb. 13, 2017

(86) PCT No.: PCT/JP2017/005157
§ 371 (c)(1),
(2) Date: Mar. 23, 2018

(87) PCT Pub. No.: WO2018/146816
PCT Pub. Date: Aug. 16, 2018

(65) Prior Publication Data
US 2020/0258813 A1 Aug. 13, 2020

(51) Int. Cl.
*H01L 23/473* (2006.01)
*H01L 25/07* (2006.01)
*H05K 7/20* (2006.01)

(52) U.S. Cl.
CPC .......... *H01L 23/473* (2013.01); *H01L 25/072* (2013.01); *H05K 7/20927* (2013.01);
(Continued)

(58) Field of Classification Search
CPC ............. H05K 7/2089; H05K 7/20927; H01L 23/473; H01L 25/072; H01L 2224/32225;
(Continued)

(56) References Cited

U.S. PATENT DOCUMENTS 3,918,084 A * 11/1975 Schierz ................. H01L 23/473
257/714
3,921,201 A * 11/1975 Eisele .................... H01L 23/427
257/714
(Continued)

FOREIGN PATENT DOCUMENTS

DE 102011079508 A1 * 3/2012 ........... H01L 23/473
DE 102010056010 A1 * 6/2012 ......... H05K 7/20927
(Continued)

OTHER PUBLICATIONS

Machine translation, Tokuyama, Japanese Pat. Pub. No. JP 2013-211299A, translation date: Nov. 5, 2020, Espacenet, all pages. (Year: 2020).*
(Continued)

*Primary Examiner* — Victoria K. Hall
(74) *Attorney, Agent, or Firm* — Ladas & Parry, LLP

(57) ABSTRACT

An electronic device has an electronic module having an insulating substrate 60, a conductor layer 20 provided on the insulating substrate 60, an electronic element 40 provided on the conductor layer 20 and a heat dissipation layer 10 provided on the insulating substrate in an opposite side of the electronic element 40 and a cooling body 100 which abuts on the heat dissipation layer 10. The cooling body 100 has a divided part 110 being provided at a portion which abuts on the heat dissipation layer 10 and being a plurality of divided regions.

5 Claims, 16 Drawing Sheets

(52) U.S. Cl.
CPC ............... *H01L 2224/32225* (2013.01); *H01L 2924/1305* (2013.01); *H01L 2924/13055* (2013.01); *H01L 2924/13091* (2013.01)

(58) Field of Classification Search
CPC ... H01L 2924/1305; H01L 2924/13055; H01L 2924/13091
See application file for complete search history.

(56) References Cited

U.S. PATENT DOCUMENTS

| | | | | |
|---|---|---|---|---|
| 5,504,378 | A * | 4/1996 | Lindberg | H02M 7/003 257/678 |
| 5,606,201 | A * | 2/1997 | Lutz | F28F 13/02 257/714 |
| 6,442,023 | B2 * | 8/2002 | Cettour-Rose | H02M 7/003 361/690 |
| 6,588,647 | B2 * | 7/2003 | Yamada | H05K 7/20872 165/170 |
| 6,594,149 | B2 * | 7/2003 | Yamada | H05K 7/20872 165/170 |
| 6,903,929 | B2 * | 6/2005 | Prasher | H01L 23/4006 361/699 |
| 6,992,887 | B2 * | 1/2006 | Jairazbhoy | H01L 23/473 165/80.4 |
| 7,042,725 | B2 * | 5/2006 | Martin | H01L 23/473 165/80.4 |
| 7,508,682 | B2 * | 3/2009 | Badarinarayan | B23K 20/1265 361/752 |
| 7,660,122 | B2 * | 2/2010 | Nakamura | H02M 7/003 361/699 |
| 7,760,503 | B2 * | 7/2010 | Aoki | H01L 23/473 361/699 |
| 8,059,418 | B2 * | 11/2011 | Blake, III | H05K 5/066 361/752 |
| 8,064,198 | B2 * | 11/2011 | Higashidani | H05K 7/20927 165/104.19 |
| 8,072,760 | B2 * | 12/2011 | Matsuo | H01L 23/473 165/104.33 |
| 8,102,652 | B2 * | 1/2012 | Toh | H01L 23/473 361/699 |
| 8,294,258 | B2 * | 10/2012 | Azuma | H01L 24/37 257/696 |
| 8,817,481 | B2 * | 8/2014 | Blake, III | B29C 65/16 361/752 |
| 8,902,589 | B2 * | 12/2014 | Gohara | H01L 23/3735 165/104.19 |
| 8,966,759 | B1 * | 3/2015 | Romero | H01L 23/473 29/890.054 |
| 9,472,488 | B2 * | 10/2016 | Gohara | F28F 3/00 |
| 10,304,756 | B2 * | 5/2019 | Inoue | H01L 23/473 |
| 2001/0055714 | A1 * | 12/2001 | Cettour-Rose | H02M 7/003 429/122 |
| 2002/0011327 | A1 * | 1/2002 | Fukazu | F28F 3/04 165/80.4 |
| 2003/0053298 | A1 * | 3/2003 | Yamada | H05K 7/20872 361/728 |
| 2004/0190318 | A1 * | 9/2004 | Tsuchiya | H02M 3/00 363/141 |
| 2004/0207968 | A1 * | 10/2004 | Martin | H05K 7/20927 361/100 |
| 2005/0035174 | A1 * | 2/2005 | Hidaka | B23K 20/1265 228/2.1 |
| 2006/0108098 | A1 * | 5/2006 | Stevanovic | H01L 23/473 165/80.4 |
| 2007/0045801 | A1 * | 3/2007 | Sugiyama | H05K 1/0271 257/684 |
| 2008/0128896 | A1 * | 6/2008 | Toh | H01L 23/473 257/712 |
| 2009/0040724 | A1 * | 2/2009 | Nishikimi | H02M 7/5387 361/699 |
| 2009/0107655 | A1 * | 4/2009 | Kajiura | H01L 23/473 165/80.3 |
| 2009/0174063 | A1 * | 7/2009 | Furukawa | H01L 23/3735 257/703 |
| 2009/0294195 | A1 * | 12/2009 | Otsuka | H05K 7/20927 180/65.275 |
| 2010/0025126 | A1 * | 2/2010 | Nakatsu | B60L 11/00 180/65.1 |
| 2010/0172091 | A1 * | 7/2010 | Nishiura | H01L 23/473 361/689 |
| 2010/0208427 | A1 * | 8/2010 | Horiuchi | H05K 7/20927 361/699 |
| 2010/0226093 | A1 * | 9/2010 | Beaupre | H01L 23/3735 361/699 |
| 2010/0230800 | A1 * | 9/2010 | Beaupre | H01L 23/3735 257/691 |
| 2010/0309630 | A1 * | 12/2010 | Jones | H05K 7/20918 361/694 |
| 2010/0315780 | A1 * | 12/2010 | Murakami | F28F 3/12 361/699 |
| 2010/0321889 | A1 * | 12/2010 | Yoshino | H05K 7/20927 361/702 |
| 2010/0326750 | A1 * | 12/2010 | Murakami | B60L 58/34 180/65.31 |
| 2010/0328893 | A1 * | 12/2010 | Higashidani | H05K 7/20927 361/702 |
| 2011/0032676 | A1 * | 2/2011 | Matsuo | H01L 23/473 361/703 |
| 2011/0049535 | A1 | 3/2011 | Soeno | |
| 2011/0128707 | A1 * | 6/2011 | Rozman | H01L 23/473 361/709 |
| 2012/0012996 | A1 * | 1/2012 | Kakiuchi | H01L 23/3677 257/712 |
| 2012/0069524 | A1 * | 3/2012 | Schulz-Harder | H01L 23/3736 361/716 |
| 2012/0139096 | A1 * | 6/2012 | Gohara | H01L 23/473 257/706 |
| 2013/0264702 | A1 * | 10/2013 | Nishi | H01L 23/3735 257/712 |
| 2014/0022727 | A1 * | 1/2014 | Bertotto | H01L 23/473 361/689 |
| 2014/0054762 | A1 * | 2/2014 | Nagaune | H01L 23/473 257/714 |
| 2014/0138075 | A1 * | 5/2014 | Yang | H01L 23/473 165/185 |
| 2014/0159216 | A1 * | 6/2014 | Ishino | H01L 23/3114 257/675 |
| 2014/0347818 | A1 | 11/2014 | Uhlemann et al. | |
| 2015/0008574 | A1 * | 1/2015 | Gohara | H01L 23/12 257/714 |
| 2015/0061112 | A1 * | 3/2015 | Bogen | H01L 23/3675 257/714 |
| 2015/0382506 | A1 * | 12/2015 | Yamada | H01L 23/3735 361/699 |
| 2016/0126167 | A1 * | 5/2016 | Ishino | H01L 23/4006 257/669 |
| 2016/0225750 | A1 * | 8/2016 | Ishii | H02M 7/003 |
| 2016/0343640 | A1 * | 11/2016 | Gohara | H05K 7/20927 |
| 2017/0148770 | A1 | 5/2017 | Ishino et al. | |
| 2017/0278770 | A1 * | 9/2017 | Kato | H01L 23/3677 |
| 2017/0311482 | A1 | 10/2017 | Ikeda et al. | |
| 2018/0024599 | A1 * | 1/2018 | Sakata | F28F 3/06 361/679.47 |
| 2018/0198378 | A1 * | 7/2018 | Xu | B60L 15/007 |
| 2018/0204784 | A1 * | 7/2018 | Kawase | H01L 25/18 |

FOREIGN PATENT DOCUMENTS

| | | | | |
|---|---|---|---|---|
| DE | 102014214209 A1 * | 1/2016 | | H05K 7/20 |
| EP | 3276658 A1 * | 1/2018 | | H01L 23/3735 |
| JP | H09275170 A | 10/1997 | | |
| JP | 2008042124 A | 2/2008 | | |
| JP | 2012-253104 A * | 12/2012 | | H01L 23/473 |
| JP | 2013-211299 A * | 10/2013 | | H01L 23/36 |
| JP | 2015126168 A | 7/2015 | | |
| JP | 2015211524 A | 11/2015 | | |
| JP | 2016115782 A | 6/2016 | | |
| WO | WO-2012147544 A1 * | 11/2012 | | H05K 7/20254 |

(56) References Cited

FOREIGN PATENT DOCUMENTS

| WO | 2015005181 A1 | 1/2015 | |
|---|---|---|---|
| WO | WO-2015194259 A1 * | 12/2015 | ............. H01L 25/07 |
| WO | 2016067383 A1 | 5/2016 | |

OTHER PUBLICATIONS

Machine translation, Nakamura, Japanese Pat. Pub. No. JP 2012-253104A, translation date: Nov. 5, 2020, Espacenet, all pages. (Year: 2020).*

Machine translation, Lutz, German Pat. Pub. No. DE 10-2014-214209A1, translation date: Nov. 5, 2020, Espacenet, all pages. (Year: 2020).*

Machine translation, Gohara, WIPO Pat. Pub. No. WO 2012-147544A1, translation date: Nov. 5, 2020, Espacenet, all pages. (Year: 2020).*

Machine translation, Maruyama, WIPO Pat. Pub. No. WO 2015-194259A1, translation date: Nov. 5, 2020, Espacenet, all pages. (Year: 2020).*

Machine translation, Bruna, German Pat. Pub. No. DE 10-2010-056010A1, translation date: Nov. 5, 2020, Espacenet, all pages. (Year: 2020).*

Machine translation, Tabata, German Pat. Pub. No. DE 10-2011-079508A1, translation date: Nov. 2, 2020, Espacenet, all pages. (Year: 2020).*

From NL2020393, Netherlands Search Report, dated Aug. 7, 2018 with machine English translation provided by NL patent office.

International Search Report for PCT/JP17/005157, dated May 9, 2017, and its English translation provided by Bing Translator.

IPRP for PCT/JP17/005157, dated Oct. 6, 2017, and its English translation provided by Bing Translator.

Written Opinion for PCT/JP17/005157, dated May 9, 2017, and its English translation provided by Bing Translator.

* cited by examiner

ELECTRONIC DEVICE

CROSS REFERENCE TO RELATED APPLICATIONS

The present application is the U.S. national phase of PCT Application PCT/JP2017/005157 filed on Feb. 13, 2017, the disclosure of which is incorporated herein by reference in its entirety.

TECHNICAL FIELD

The present invention relates to an electronic device having an electronic module and a cooling body.

BACKGROUND ART

Conventionally, in an electronic module such as a transfer power module, a heat radiation plate (heat radiation layer) made of copper or the like is provided on a back surface of the electronic module to cool embedded electronic elements or the like (for example, refer to JP 2015-211524 A). If the heat radiation layer is provided as described above, a function as a capacitor may be realized by a conductor layer, an insulating substrate, and the heat radiation layer (the capacitor function may be formed). If the capacitor function is formed as described above, noise due to the electronic elements in the electronic module may be discharged to the outside of the electronic module via the heat radiation layer.

SUMMARY OF INVENTION

Technical Problem

In view of such a problem, the present invention provides an electronic device capable of reducing noise.

Solution to Problem

An electronic device according to an aspect of the present invention may comprise:
an electronic module having an insulating substrate, a conductor layer provided on the insulating substrate, an electronic element provided on the conductor layer and a heat dissipation layer provided on the insulating substrate in an opposite side of the electronic element; and
a cooling body which abuts on the heat dissipation layer;
wherein the cooling body may have a divided part being provided at a portion which abuts on the heat dissipation layer and being a plurality of divided regions.

In the electronic module according to an aspect of the present invention,
the divided part may have abutting parts that abut on the heat dissipation layer and a plurality of groove parts provided between the abutting parts.

In the electronic module according to an aspect of the present invention,
the divided part may have a plurality of divided units.

In the electronic module according to an aspect of the present invention,
the electronic element may include a switching element.

In the electronic module according to an aspect of the present invention,
the divided part may entirely cover the electronic element when viewed from a side of the cooling body.

In the electronic module according to an aspect of the present invention,
the divided part may have a grid shape.

In the electronic module according to an aspect of the present invention,
a cooling fluid may flow on a divided part.

In the electronic module according to an aspect of the present invention,
a lubricant may be provided on the divided part.

In the electronic module according to an aspect of the present invention,
the insulating substrate may have a first insulating substrate and a second insulating substrate,
the electronic element may have a first electronic element and a second electronic element, and
the heat dissipation layer may have a first heat dissipation layer and a second heat dissipation layer,
the first electronic element may be provided on one side of the first insulating substrate,
the first heat dissipation layer may be provided on the other side of the first insulating substrate,
the second electronic element may be provided on one side of the first electronic element,
the second insulating substrate may be provided on one side of the second electronic element,
the second heat dissipation layer may be provided on one side of the second insulating substrate,
at least one of the first electronic element and the second electronic element may be a switching element, when the first electronic element is a switching element, the divided part may be provided on a part which abuts on the first heat dissipation layer, and when the second electronic element is a switching element, the divided part may be provided on a part which abuts on the second heat dissipation layer.

Advantageous Effects of Invention

In the present invention, the cooling body has the divided part being provided at a portion that abuts on the heat dissipation layer and being a plurality of divided regions. Thus, the contact area between the cooling body and the heat dissipation layer can be reduced and a resistance formed between the heat dissipation layer and the cooling body can be increased. As a result, noise emitted from the electronic device can be suppressed.

DESCRIPTION OF EMBODIMENTS

First Embodiment

<<Configuration>>

An electronic device of the present embodiment may have an electronic module and a cooling body 100 that is composed of a radiating fin, etc., and that abuts on a heat dissipation layer 10 of the electronic module which will be described later.

Figure 1:
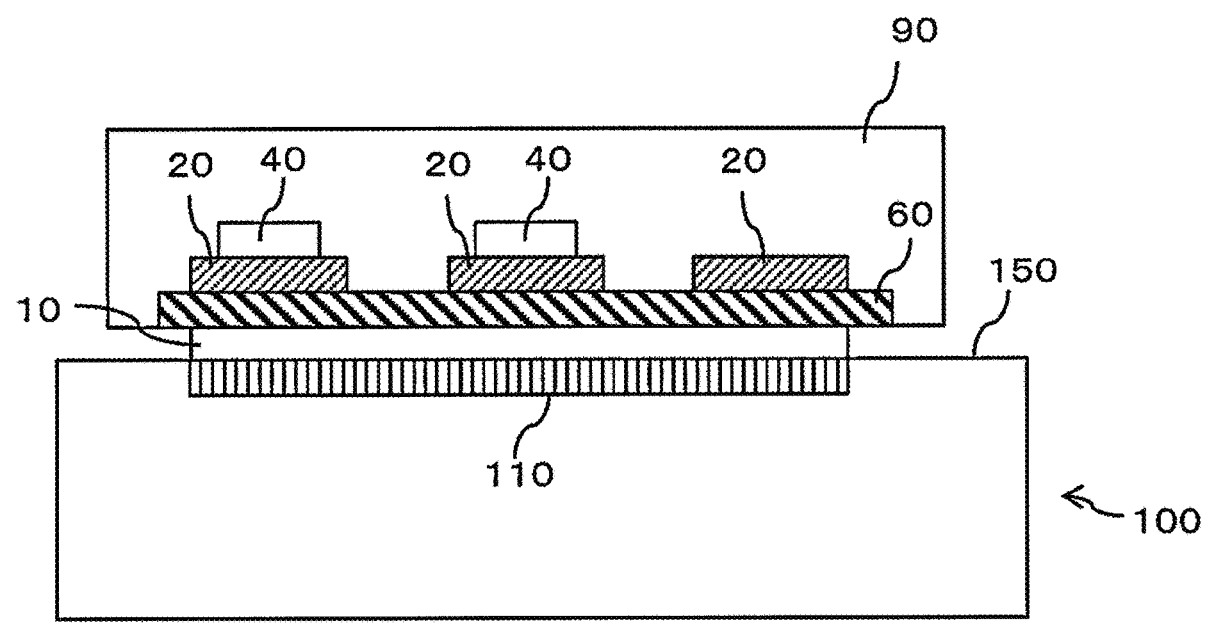
FIG. 1 is a vertical cross-sectional view showing an electronic device of a first embodiment of the present invention.

As shown in FIG. 1, an electronic module may have an insulating substrate 60, conductor layers 20 provided on the front side (the upper side of FIG. 1) of the insulating substrate 60, electronic elements 40 provided on conductor layers 20, and a heat dissipation layer 10 provided on the back side of the insulating substrate 60 (the opposite side of the electronic elements 40). For the heat dissipation layer 10, a heat dissipation plate composed of a metal such as copper can also be used.

Figure 3:
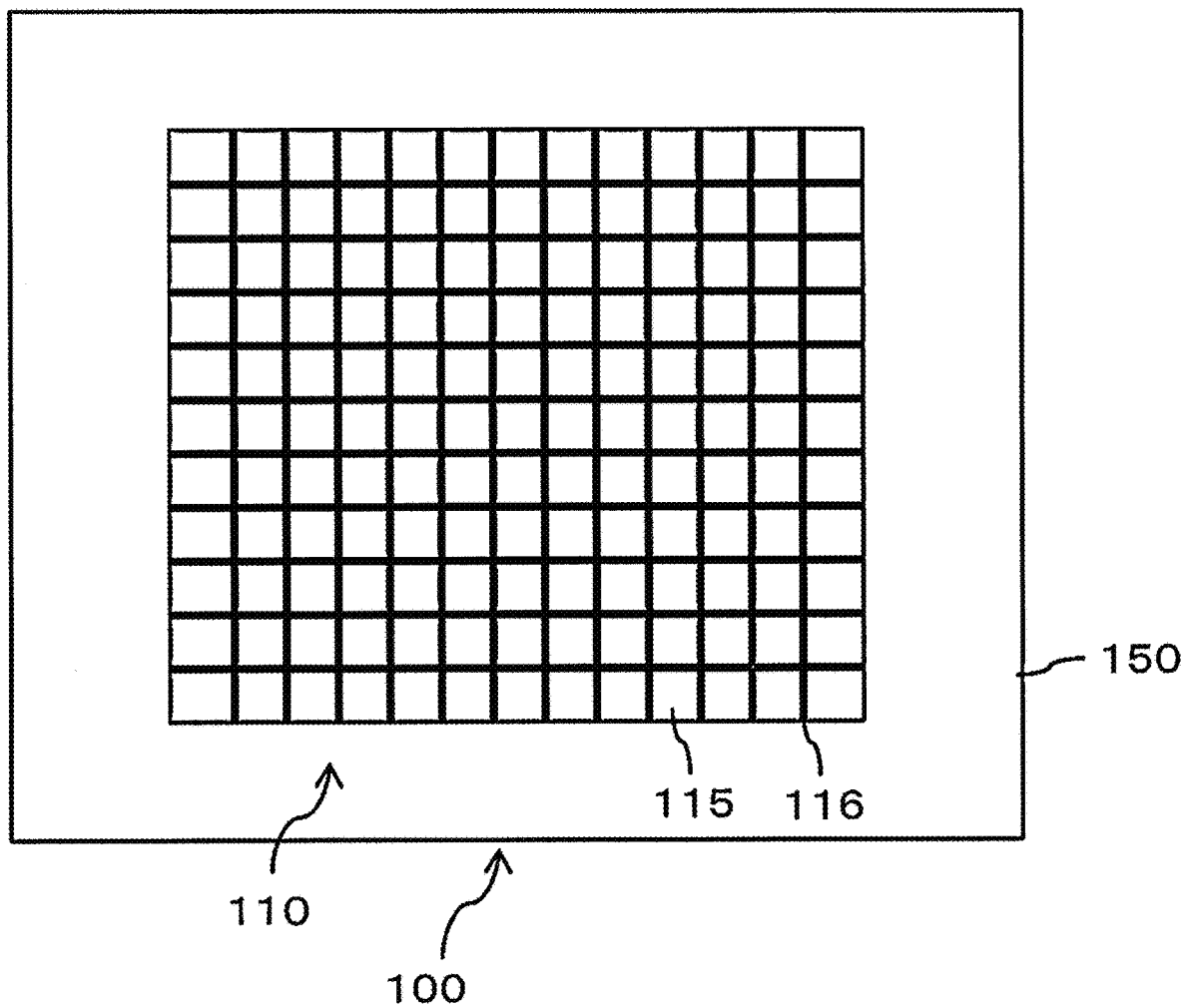
FIG. 3 is a plan view showing a divided part of the cooling body in the first embodiment of the present invention.

The cooling body 100 may have a divided part 110 being provided at a portion that abuts on the heat dissipation layer 10, and the divided part 110 is a plurality of divided regions. As shown in FIG. 3, the divided part 110 thus being a plurality of divided regions may have abutting parts 115 that abut on the heat dissipation layer 10 and groove parts 116 provided between the abutting parts 115.

In the present embodiment, an example of the electronic module can include a semiconductor module, and an example of the electronic elements 40 can include semiconductor elements. However, the electronic module and the electronic elements 40 are not limited thereto and the "semiconductor" does not necessarily need to be used.

As shown in FIG. 1, the insulating substrate 60, the conductor layers 20, and the electronic elements 40 may be covered with a sealing part 90 composed of a sealing resin, etc. As shown in FIG. 1, the back side of the sealing part 90 may have the same height position as the back side of the insulating substrate 60. Although FIG. 1 shows an aspect in which the heat dissipation layer 10 is provided on the back side of the insulating substrate 60 and the heat dissipation layer 10 protrudes from the back side of the sealing part 90, the configuration is not limited thereto, and the insulating substrate 60 may be buried in the sealing part 90 and the back side of the heat dissipation layer 10 may have the same height position as the back side of the sealing part 90.

The electronic elements 40 may include a switching element. Examples of the switching element can include a FET such as a MOSFET, a bipolar transistor, and an IGBT, and a typical example can include a MOSFET.

The conductor layers 20 may be patterned on the insulating substrate 60, by which circuits may be formed. The heat dissipation layer 10 may be a metal plate. The conductor layers 20 and the heat dissipation layer 10 may be composed of, for example, copper.

The divided part 110 may entirely cover a single or a plurality of electronic elements 40 when viewed from the side of the cooling body 100 (when viewed from the lower side of FIG. 1).

Figure 2:
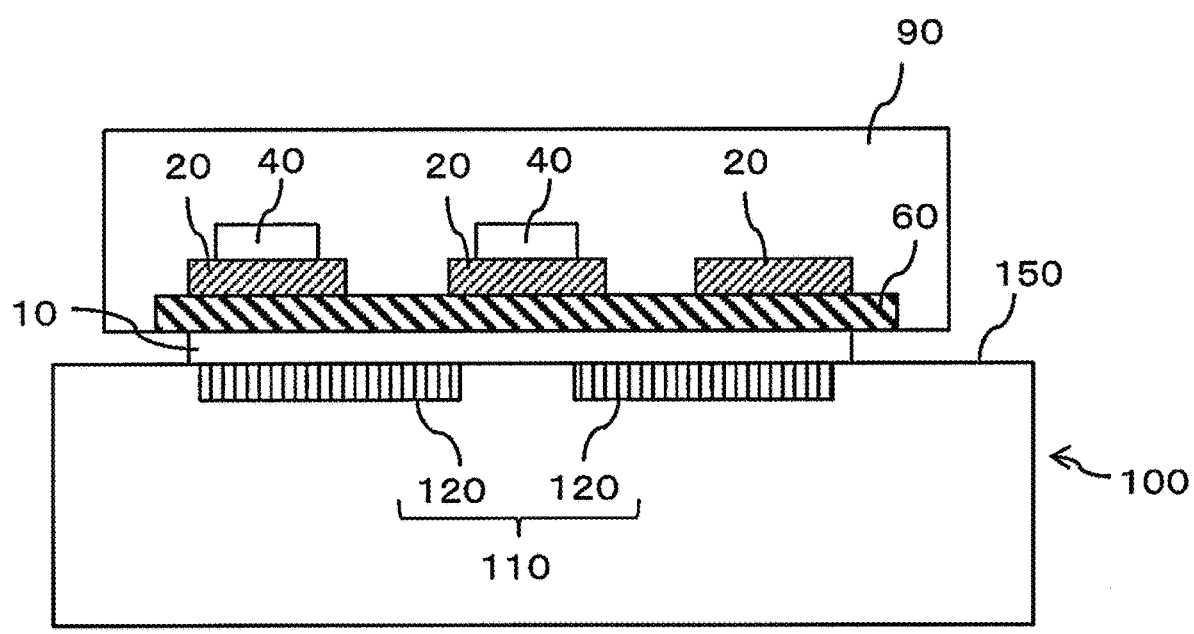
FIG. 2 is a vertical cross-sectional view showing an aspect in which a cooling body has divided units in the first embodiment of the present invention.
Figure 4:
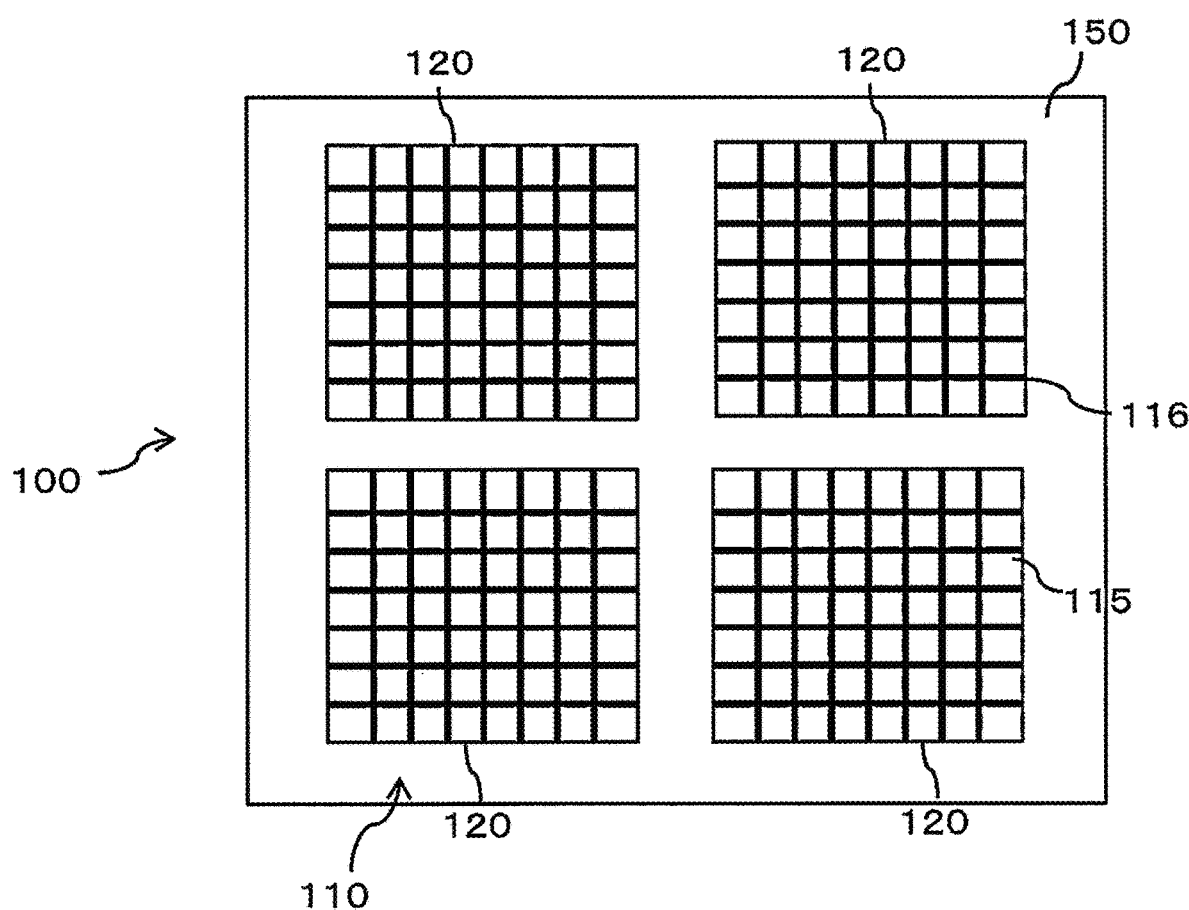
FIG. 4 is a plan view showing an aspect in which the cooling body has divided units in the first embodiment of the present invention.
Figure 5:
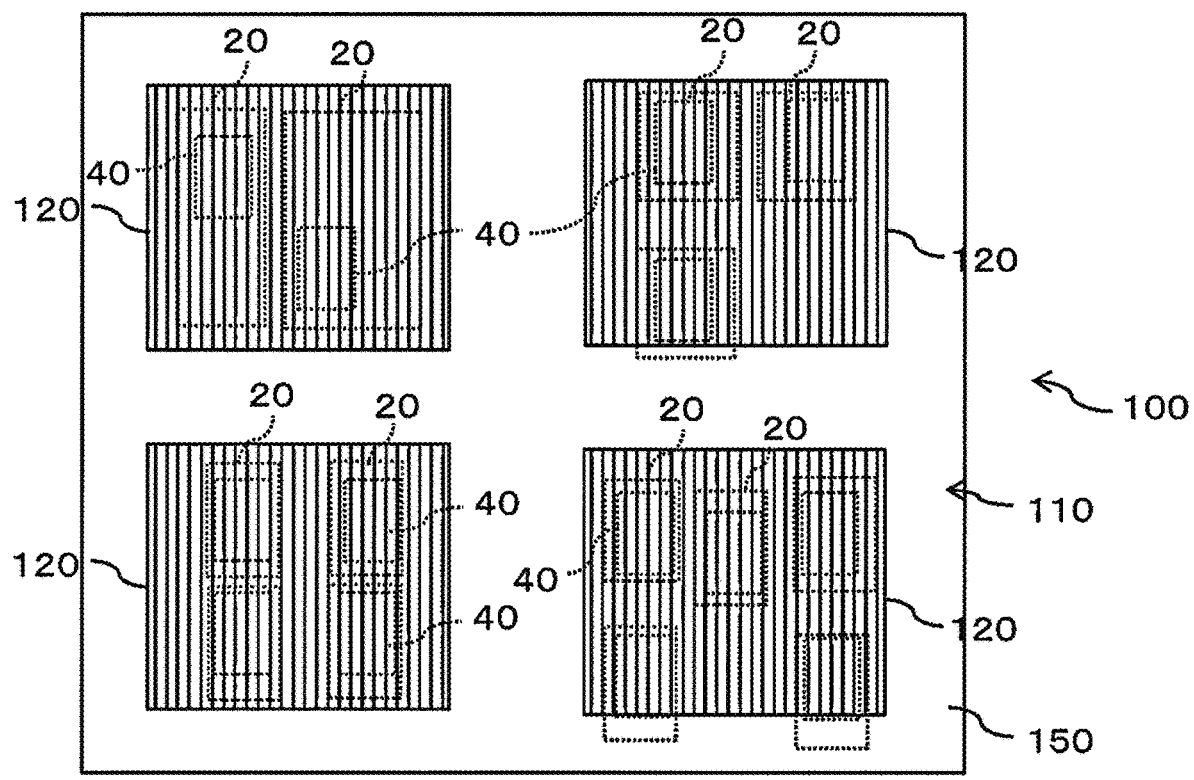
FIG. 5 is a plan view showing a positional relationship between electronic elements and conductor layers and a divided unit, and showing the electronic elements and the conductor layers by dashed lines in the first embodiment of the present invention.
Figure 6:
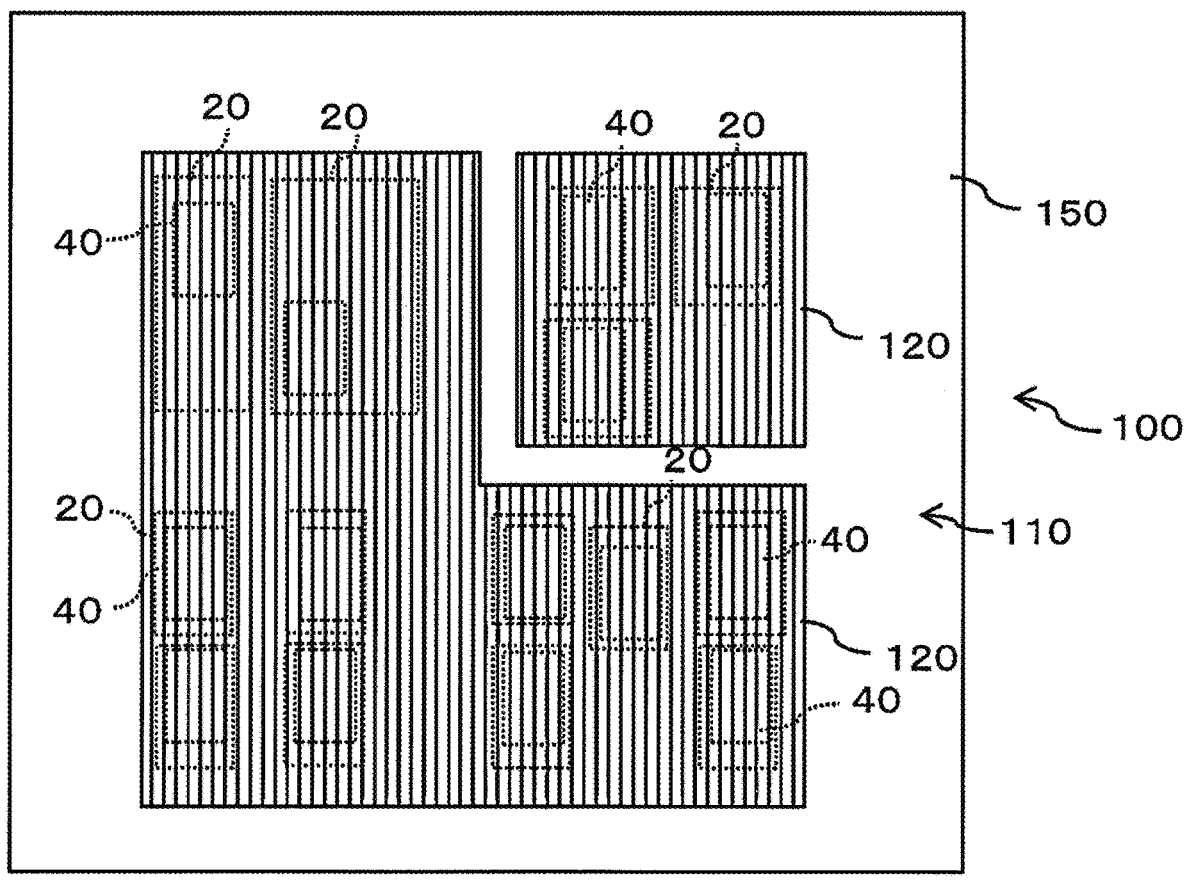
FIG. 6 is a plan view corresponding to FIG. 5 and showing an aspect different than that of FIG. 5.

As shown in FIGS. 2 and 4, the divided part 110 may have a plurality of divided units 120. As shown in FIGS. 5 and 6, at least some of a plurality of divided units 120 may entirely cover a single or a plurality of electronic elements 40 when viewed from the side of the cooling body 100.

Figure 10:
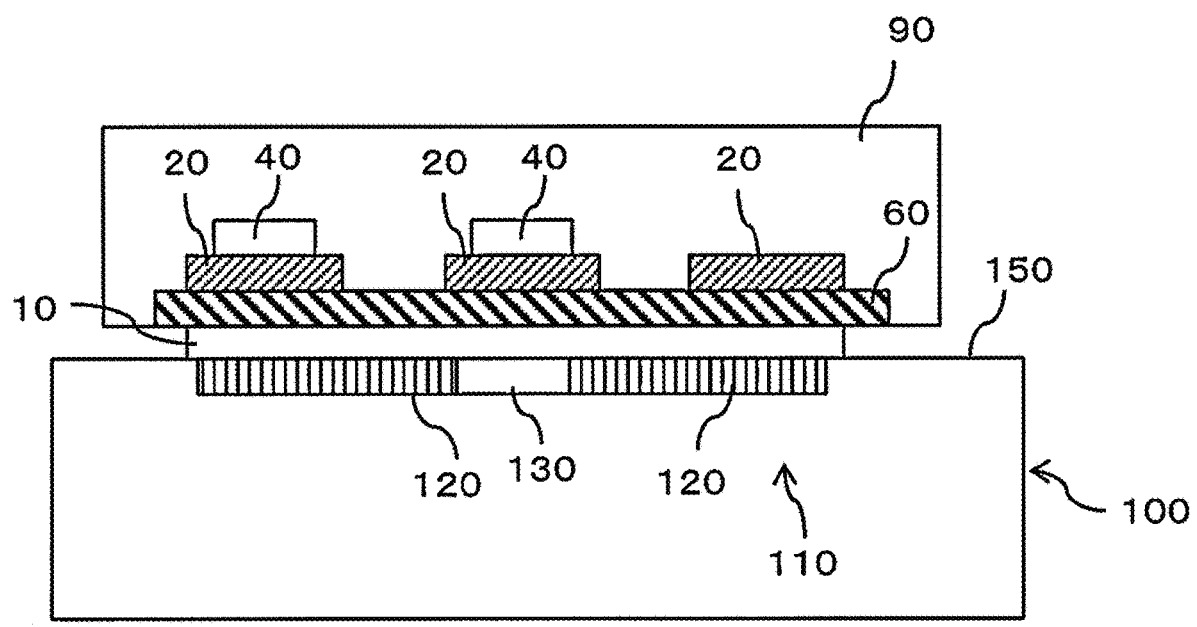
FIG. 10 is a vertical cross-sectional view corresponding to FIG. 2 and showing an aspect different than that of FIG. 2.

A region in which the divided part 110 is not provided may have a flat surface 150. When, in a case in which the region thus has the flat surface 150, the heat dissipation layer 10 is located on the flat surface 150, the flat surface 150 abuts on the heat dissipation layer 10. When divided units 120 are provided, a flat surface 150 may be provided between the divided units 120 and may abut on the heat dissipation layer 10. On the other hand, as shown in FIG. 10, a portion between divided units 120 may be a recess part 130. In a case in which the portion is thus the recess part 130, the heat dissipation layer 10 and the cooling body 100 do not come into contact with each other at the portion between the divided units 120.

As shown in FIGS. 3 and 4, the divided part 110 may have a grid shape. When the divided part 110 has a grid shape, groove parts 116 between abutting parts 115 are provided in directions in which the groove parts 116 intersect each other.

A divided unit 120 may be provided so as to include the entire area in which conductor layers 20 are disposed. As an example, upper-left and lower-left divided units 120 of FIG. 5 cover the entire area in which conductor layers 20 and electronic elements 40 are disposed, when viewed from the divided unit 120's side.

A divided unit 120 may be provided so as to include the entire area in which electronic elements 40 are disposed. As an example, upper-left, lower-left, and upper-right divided units 120 of FIG. 5 cover the entire area in which electronic elements 40 are disposed, when viewed from the divided unit 120's side.

The abutting parts 115 may be provided entirely independently of the positions of electronic elements 40 and conductor layers 20. That is, the abutting parts 115 may be provided in a predetermined pattern, and the divided part 110 may be disposed regardless of whether the divided part 110 is positioned at a location where the divided part 110 covers electronic elements 40 or conductor layers 20. When such an aspect is adopted, it is beneficial in terms of that the divided part 110 can be easily provided.

In addition, the divided units 120 may have different shapes or may have the same shape. As shown in FIGS. 4 and 5, the divided units 120 may be rectangular, or as shown in FIG. 6, at least one of the plurality of divided units 120 may be L-shaped. Note that although FIGS. 5 and 6 do not show the configuration of the divided units 120, the divided units 120 of FIGS. 5 and 6 may have a grid shape such as that shown in FIG. 4.

Figure 8:
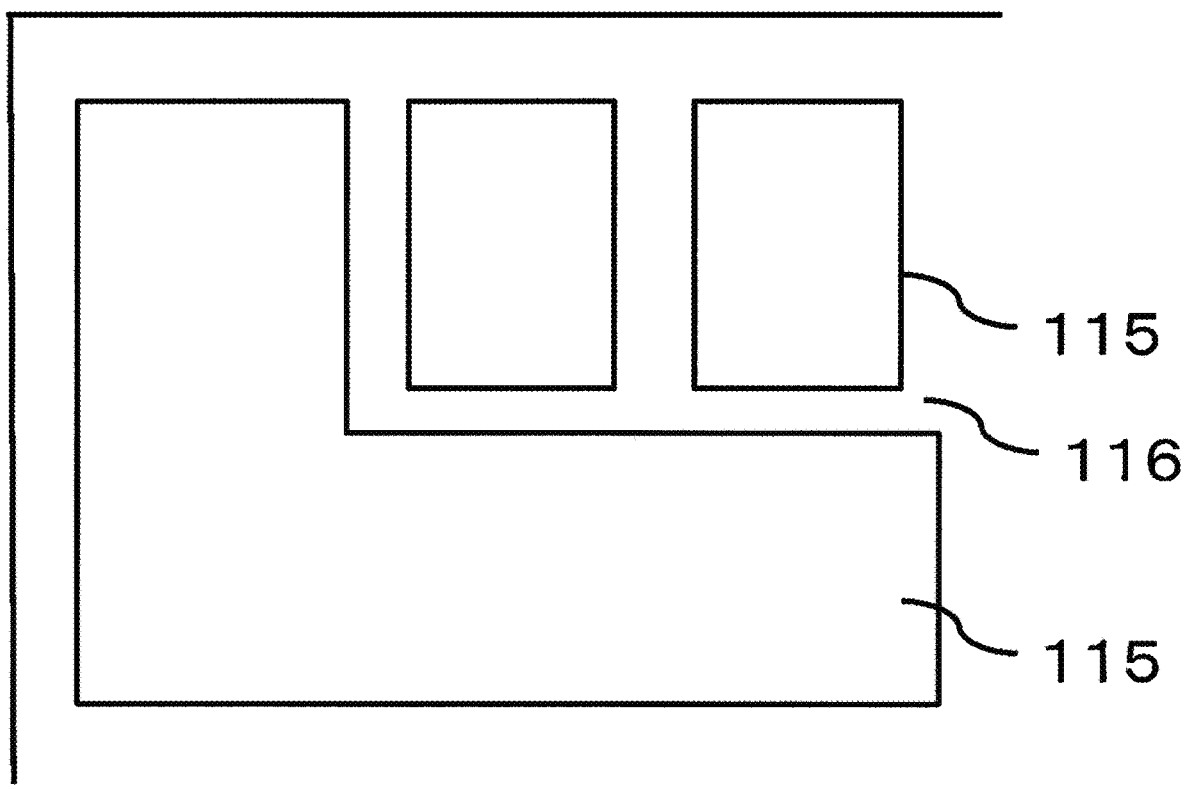
FIG. 8 is an enlarged plan view showing a variant of abutting parts and a groove part in the first embodiment of the present invention.
Figure 9:
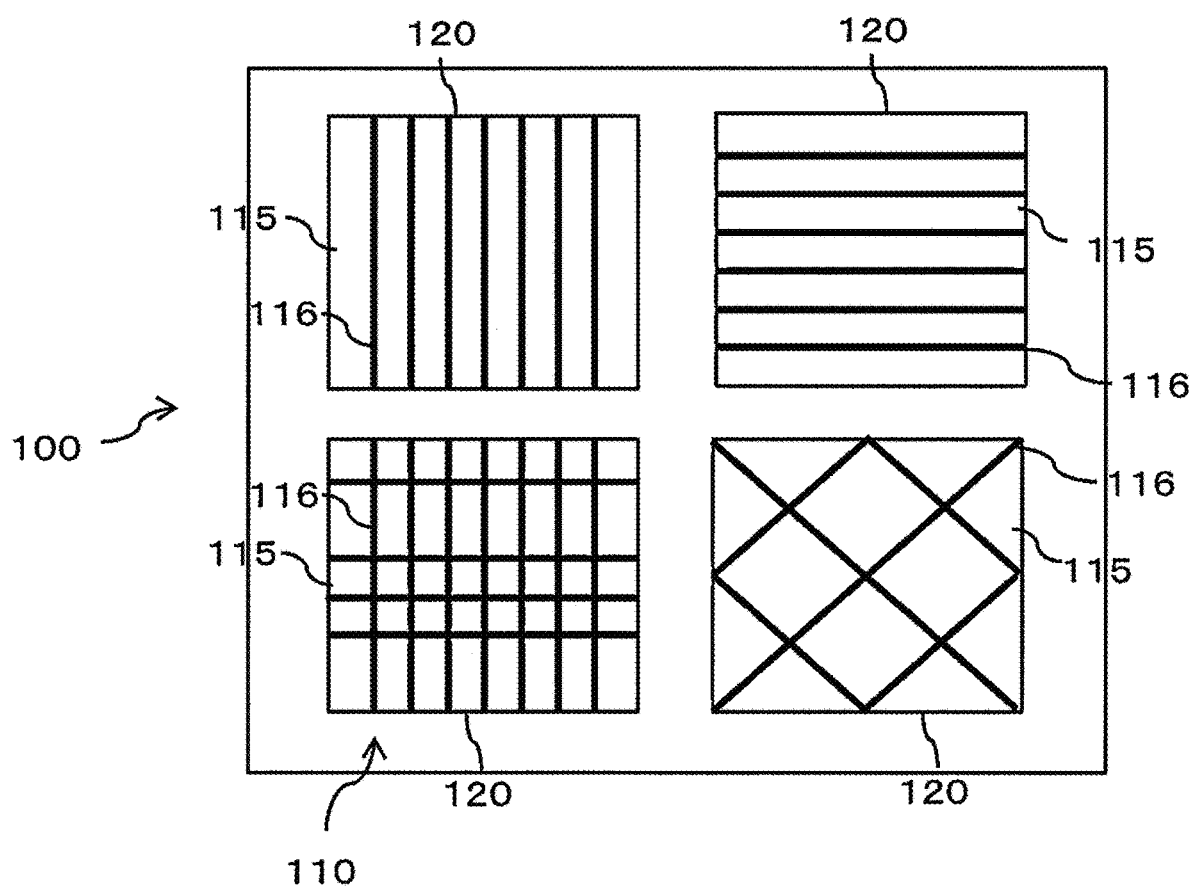
FIG. 9 is a plan view showing a plurality of examples of an aspect of divided units that can be used in the first embodiment of the present invention.

The divided part 110 or the divided units 120 do(es) not need to have a grid shape. For example, as shown in FIG. 8, rectangular abutting parts 115 and an L-shaped abutting part 115 may be mixed, or other shapes may be adopted. For example, as shown in upper-left and upper-right divided units 120 of FIG. 9, groove parts 116 may be provided linearly and the groove parts 116 may not intersect each other, or as shown in a lower-left divided unit 120 of FIG. 9, groove parts 116 may be disposed at different intervals, or as shown in a lower-right divided unit 120 of FIG. 9, groove parts 116 may be provided obliquely.

Functions and Effects

Next, functions and effects that are brought about by the present embodiment including the above-described configurations and that have not been described yet will be described. Various configurations described in the "Functions and Effects" can also be adopted.

When an aspect is adopted in which, as shown in FIG. 1, the cooling body 100 has the divided part 110 being provided at a portion that abuts on the heat dissipation layer 10 and being a plurality of divided regions, the contact area between the cooling body 100 and the heat dissipation layer 10 can be reduced and a resistance formed between the heat dissipation layer 10 and the cooling body 100 can be increased. As a result, noise emitted from the electronic device can be suppressed.

Particularly, when the electronic elements 40 have a switching element, by increasing a resistance formed between the heat dissipation layer 10 and the cooling body 100, the emission of noise generated from the switching element from the electronic device can be prevented. Note that in this specification the term "electronic elements 40" (including "first electronic elements 41" and "second electronic elements 42" which will be described later) collectively refers to a single or a plurality of electronic elements 40. Hence, the expression "the electronic elements 40 have a switching element" refers to that at least one of the electronic elements 40 is a switching element. Note that the switching element not only causes noise but also generates high heat. Hence, efficient release of heat generated from the switching element is also an important problem.

When an aspect is adopted in which a divided part 110 or a divided unit 120 is provided so as to include the entire area in which electronic elements 40 are disposed, when viewed from the side of the cooling body 100 (see the upper-left, lower-left, and upper-right divided units 120 of FIG. 5), the resistance between the heat dissipation layer 10 and the cooling body 100 can be increased at locations corresponding to the electronic elements 40 that generate noise (between the electronic elements 40 and the cooling body 100), and the emission of noise from the electronic device can be made difficult. In addition, when the electronic elements 40 have a switching element, a divided part 110 or a divided unit 120 may be provided so as to include the entire area in which at least the switching element is disposed, when viewed from the side of the cooling body 100. When such an aspect is adopted, the resistance at a location corresponding to a switching element that is likely to cause a noise problem can be increased, which in turn can more securely make it difficult to emit noise from the electronic device.

When an aspect is adopted in which a divided part 110 or a divided unit 120 is provided so as to include the entire area in which conductor layers 20 are disposed, when viewed from the side of the cooling body 100 (see the upper-left and lower-left divided units 120 of FIG. 5), the resistance between the heat dissipation layer 10 and the cooling body 100 can be directly increased at locations corresponding to the conductor layers 20 that transfer noise from electronic elements 40 (between the conductor layers 20 and the cooling body 100), and the emission of noise from the electronic device can be made difficult. In addition, when the electronic elements 40 have a switching element, a divided part 110 or a divided unit 120 may be provided so as to include the entire area in which at least a conductor layer 20 provided with the switching element is disposed, when viewed from the side of the cooling body 100. When such an aspect is adopted, the resistance at a location corresponding to a switching element that is likely to cause a noise problem can be increased, which in turn can more securely make it difficult to emit noise from the electronic device.

Figure 7:
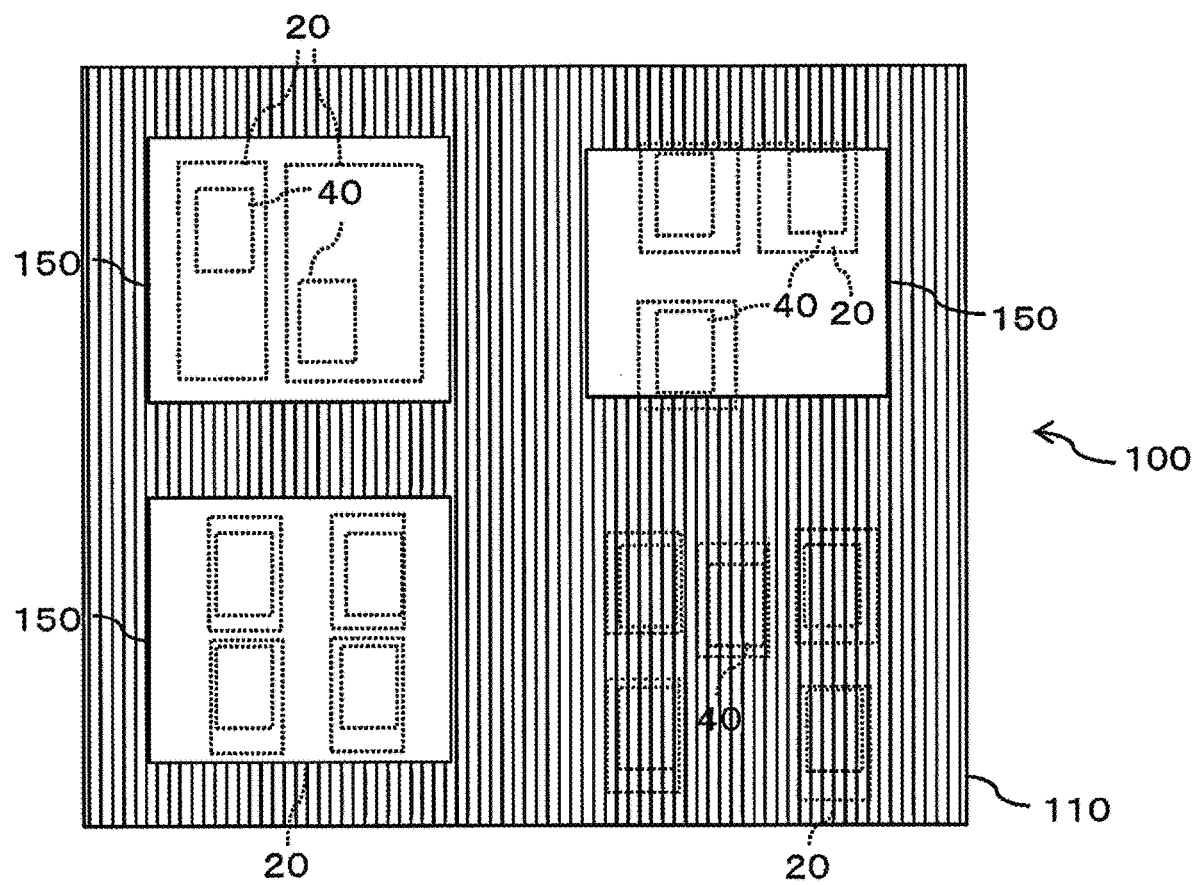
FIG. 7 is a plan view corresponding to FIG. 5 and showing an aspect different than those of FIGS. 5 and 6.

In addition, as shown on the upper-left, lower-left, and upper-right sides in FIG. 7, a divided part 110 or a divided unit 120 may not be provided in an area in which electronic elements 40 are disposed, when viewed from the side of the cooling body 100, and the area in which the electronic elements 40 are disposed may have a flat surface 150 and the heat dissipation layer 10 may abut on the cooling body 100. When such an aspect is adopted, although noise by electronic elements 40 can only be indirectly suppressed, it is beneficial in terms of that heat generation by the electronic elements 40 can be efficiently released.

In addition, as shown on the upper-left and lower-left sides in FIG. 7, a divided part 110 or a divided unit 120 may not be provided in an area in which conductor layers 20 provided with electronic elements 40 are disposed, when viewed from the side of the cooling body 100, and the area in which the conductor layers 20 are disposed may have a flat surface 150 and the heat dissipation layer 10 may abut on the cooling body 100. When such an aspect is adopted, although noise by electronic elements 40 can only be indirectly suppressed, it is beneficial in terms of that heat generation by the electronic elements 40 can be efficiently released.

As shown on the lower-right side in FIG. 7, a divided part 110 or a divided unit 120 may be provided in an area in which a specific electronic element 40 (e.g., a switching element) is disposed, when viewed from the side of the cooling body 100. By adopting such an aspect, the resistance between the heat dissipation layer 10 and the cooling body 100 is increased for a specific electronic element 40 (e.g., a switching element) that is likely to generate noise, which can make it difficult to emit noise from the electronic device.

A divided unit 120 may have the same shape as a conductor layer 20 provided with an electronic element 40 or a conductor layer 20 provided with a switching element when viewed from the side of the cooling body 100, and each divided unit 120 may be provided so as to face its corresponding conductor layers 20. When such an aspect is adopted, the resistance between an electronic element 40 and the cooling body 100 can be directly reduced in a region in which a conductor layer 20 is provided.

Second Embodiment

Next, a second embodiment of the present invention will be described. In the second embodiment, the same or similar members, etc., as/to those of the first embodiment are denoted by the same reference signs, and description thereof is omitted.

Figure 11:
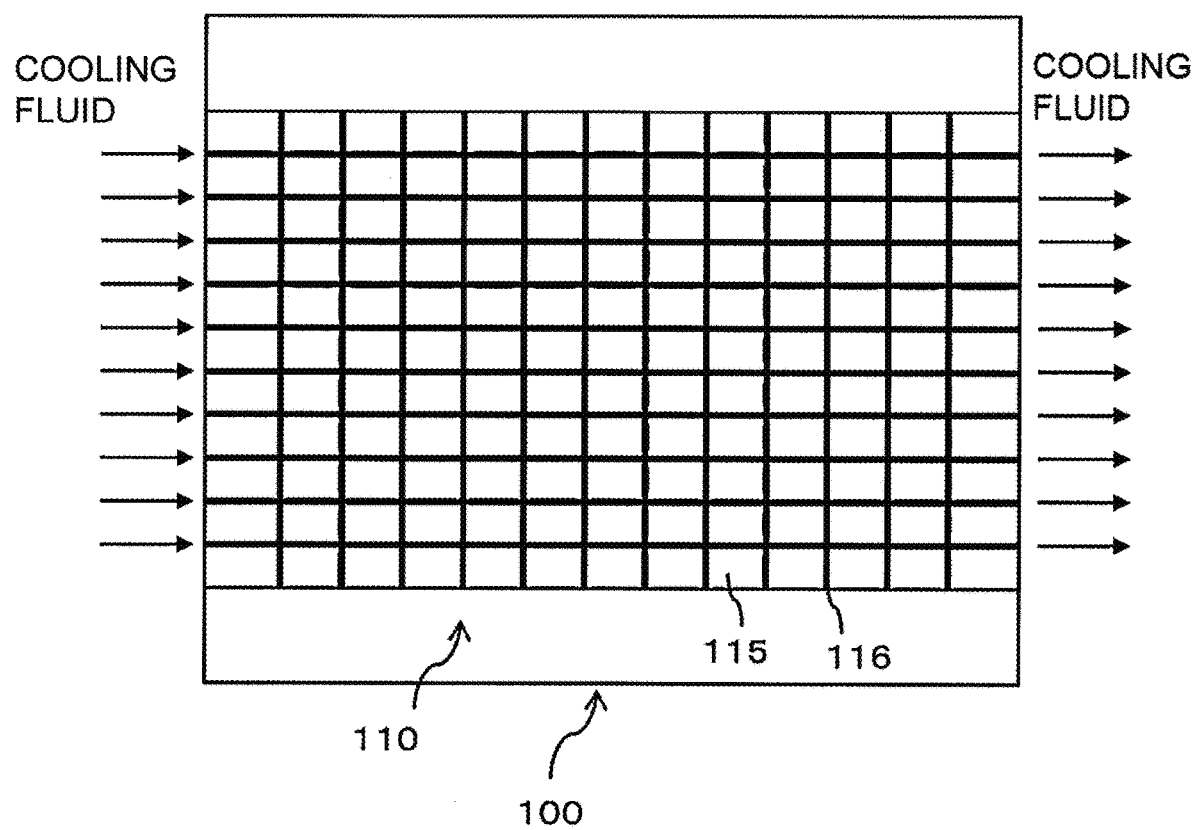
FIG. 11 is a plan view showing a cooling body in a second embodiment of the present invention.
Figure 12:
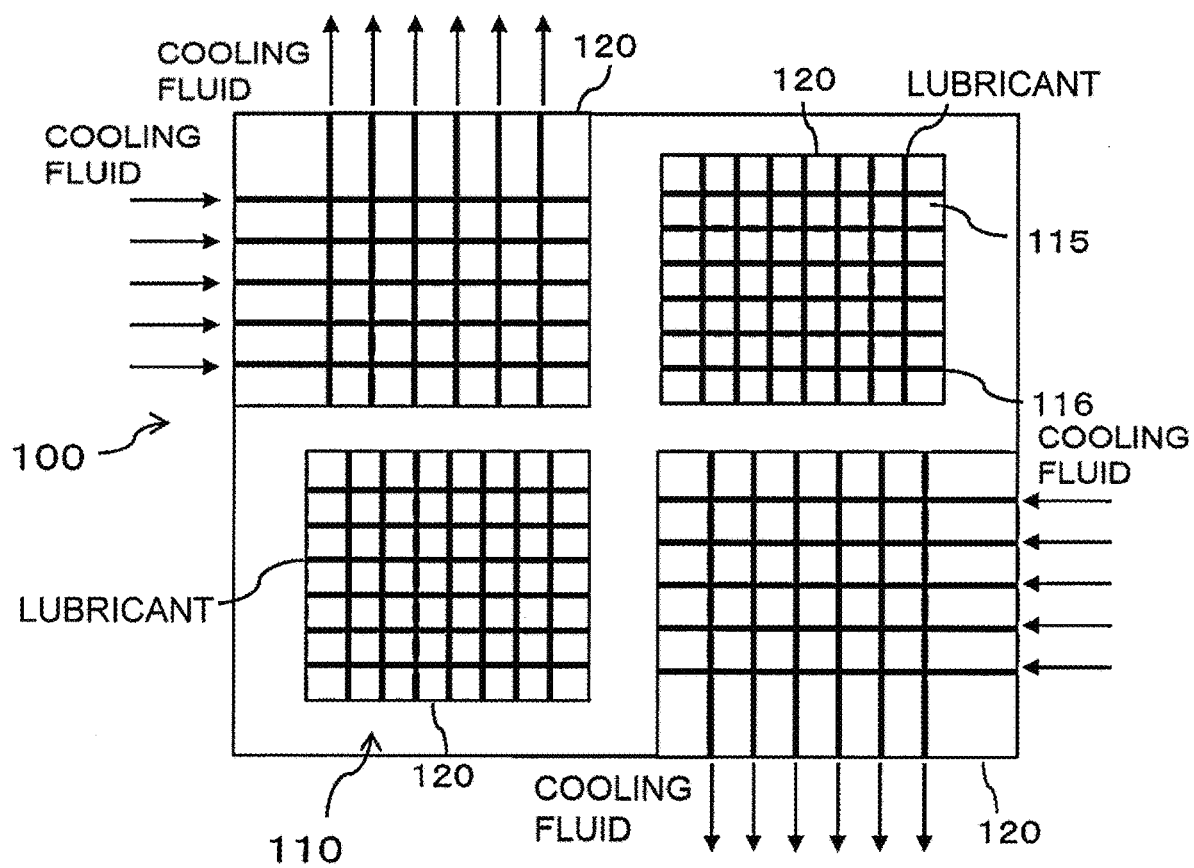
FIG. 12 is a plan view showing a cooling body in another aspect of the second embodiment of the present invention.

In the present embodiment, a cooling fluid such as cooling water may be allowed to flow on a divided part 110. More specifically, as shown in FIGS. 11 and 12, a cooling fluid may be allowed to flow through groove parts 116 of a divided part 110 or a divided unit 120. By adopting an aspect in which a cooling fluid thus flows through, it is beneficial in terms of that while the generation of noise by an electronic apparatus is suppressed by increasing a resistance value compared to a region including abutting parts 115, heat dissipation performance can be maintained to a certain extent by the cooling fluid.

In addition, as shown in FIG. 12, a lubricant such as thermal grease may be provided on a divided part 110. More specifically, a lubricant such as thermal grease may be provided in groove parts 116 of a divided part 110. By adopting an aspect in which a lubricant is thus provided, it is beneficial in terms of that while the generation of noise by an electronic apparatus is suppressed by increasing a resistance value compared to a region including abutting parts 115, heat dissipation performance can be maintained to a certain extent by the lubricant.

In addition, both a cooling fluid and a lubricant may be used. More specifically, an aspect may be adopted in which, as shown in FIG. 12, a cooling fluid is allowed to flow through some of the groove parts 116 and a lubricant is provided to some of the groove parts 116. In this case, it is beneficial in terms of that while the generation of noise by an electronic apparatus is suppressed by increasing a resistance value compared to a region including abutting parts 115, heat dissipation performance can be maintained to a certain extent by the cooling fluid or lubricant. In addition, the groove parts 116 through which the cooling fluid flows do not communicate with the groove parts 116 provided with the lubricant, by which the cooling fluid is prevented from flowing through the groove parts 116 provided with the lubricant. As an example, groove parts 116 of upper-left and lower-right divided units 120 of FIG. 12 do not communicate with groove parts 116 of upper-right and lower-left divided units 120 of FIG. 12.

Note that since a cooling fluid and a lubricant have different resistance values and different cooling effects, they may be selected as appropriate and used. For example, the generation of noise may be efficiently suppressed by selecting one of a cooling fluid and a lubricant that has a larger resistance value for an area including a region provided with electronic elements 40 when viewed from the side of the cooling body 100, and selecting one of a cooling fluid and a lubricant that has a smaller resistance value for an area not including a region provided with electronic elements 40 when viewed from the side of the cooling body 100. In addition, the generation of noise may be efficiently suppressed by selecting one of a cooling fluid and a lubricant that has a larger resistance value for an area including a region provided with a switching element when viewed from the side of the cooling body 100, and selecting one of a cooling fluid and a lubricant that has a smaller resistance value for an area not including a region provided with a switching element when viewed from the side of the cooling body 100.

In addition, heat dissipation efficiency may be increased by selecting one of a cooling fluid and a lubricant that has higher heat dissipation performance for an area including a region provided with electronic elements 40 when viewed from the side of the cooling body 100, and selecting one of a cooling fluid and a lubricant that has lower heat dissipation performance for an area not including a region provided with electronic elements 40 when viewed from the side of the cooling body 100. In addition, heat dissipation efficiency may be increased by selecting one of a cooling fluid and a lubricant that has higher heat dissipation performance for an area including a region provided with a switching element when viewed from the side of the cooling body 100, and selecting one of a cooling fluid and a lubricant that has lower heat dissipation performance for an area not including a region provided with a switching element when viewed from the side of the cooling body 100.

In the present embodiment, various configurations (including variants) that are described in the first embodiment can be adopted.

Third Embodiment

Next, a third embodiment of the present invention will be described. In the third embodiment, the same or similar members, etc., as/to those of the first or second embodiment are denoted by the same reference signs, and description thereof is omitted.

Figure 13:
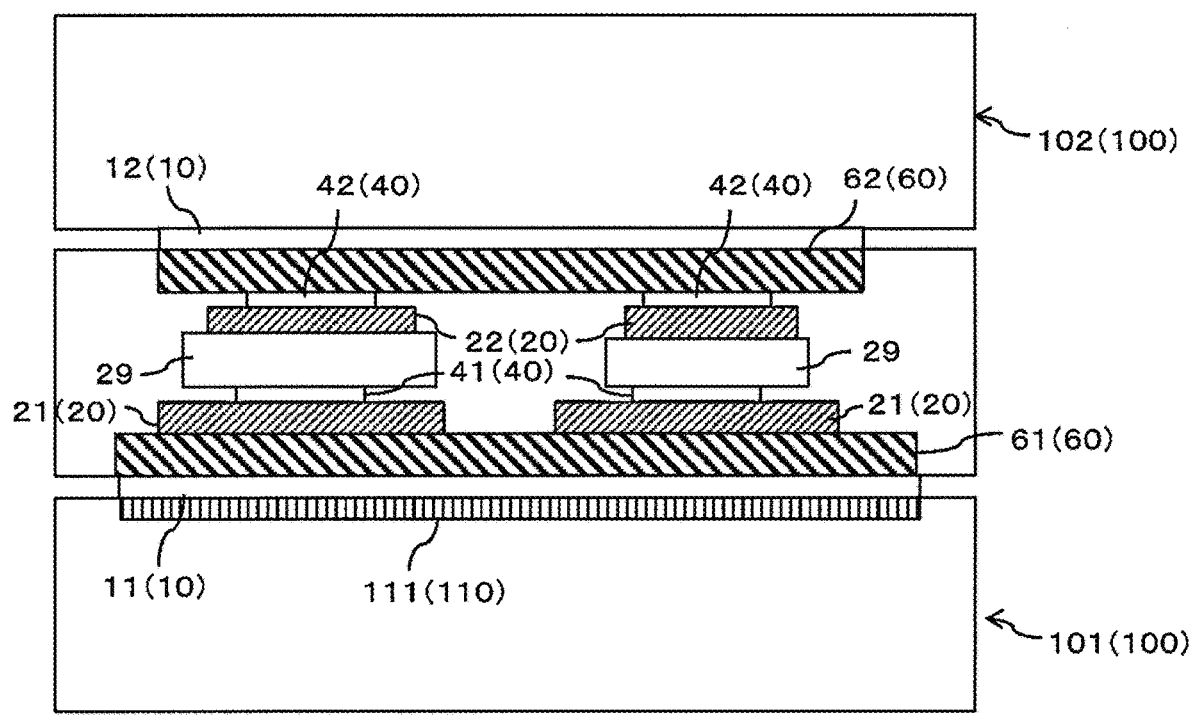
FIG. 13 is a vertical cross-sectional view showing an electronic device of a third embodiment of the present invention.

In the third embodiment, electronic elements 40 are disposed so as to be stacked on top of each other, and have a stacked structure. More specifically, as shown in FIG. 13, insulating substrates 60 may have a first insulating substrate 61 and a second insulating substrate 62, electronic elements 40 may have first electronic elements 41 and second electronic elements 42, and heat dissipation layers 10 may have a first heat dissipation layer 11 and a second heat dissipation layer 12. The first electronic elements 41 may be provided on one side (the upper side of FIG. 13) of the first insulating substrate 61, and the first heat dissipation layer 11 may be provided on the other side (the lower side of FIG. 13) of the first insulating substrate 61. The second electronic elements 42 may be provided on one side of the first electronic elements 41, the second insulating substrate 62 may be provided on one side of the second electronic elements 42, and the second heat dissipation layer 12 may be provided on one side of the second insulating substrate 62. In addition, conductor layers 20 may have first conductor layers 21 and second conductor layers 22, the first electronic elements 41 may be provided on one side of the first conductor layers 21, and the second electronic elements 42 may be provided on one side of the second conductor layers 22.

At least either one of the first electronic elements 41 and the second electronic elements 42 may have a switching element. Then, when the first electronic elements 41 have a switching element, a divided part 110 may be provided to a first cooling body 101 which is provided on the first heat dissipation layer 11's side (see FIG. 13). In this case, the divided part 110 is provided at a portion of the first cooling body 101 that abuts on the first heat dissipation layer 11. When the second electronic elements 42 have a switching element, a divided part 110 may be provided to a second cooling body 102 which is provided on the second heat dissipation layer 12's side (see FIG. 14). In this case, the divided part 110 is provided at a portion of the second cooling body 102 that abuts on the second heat dissipation layer 12. In the present embodiment, the divided part 110 provided to the first cooling body 101 is referred to as a first divided part 111, and the divided part 110 provided to the second cooling body 102 is referred to as a second divided part 112.

Figure 14:
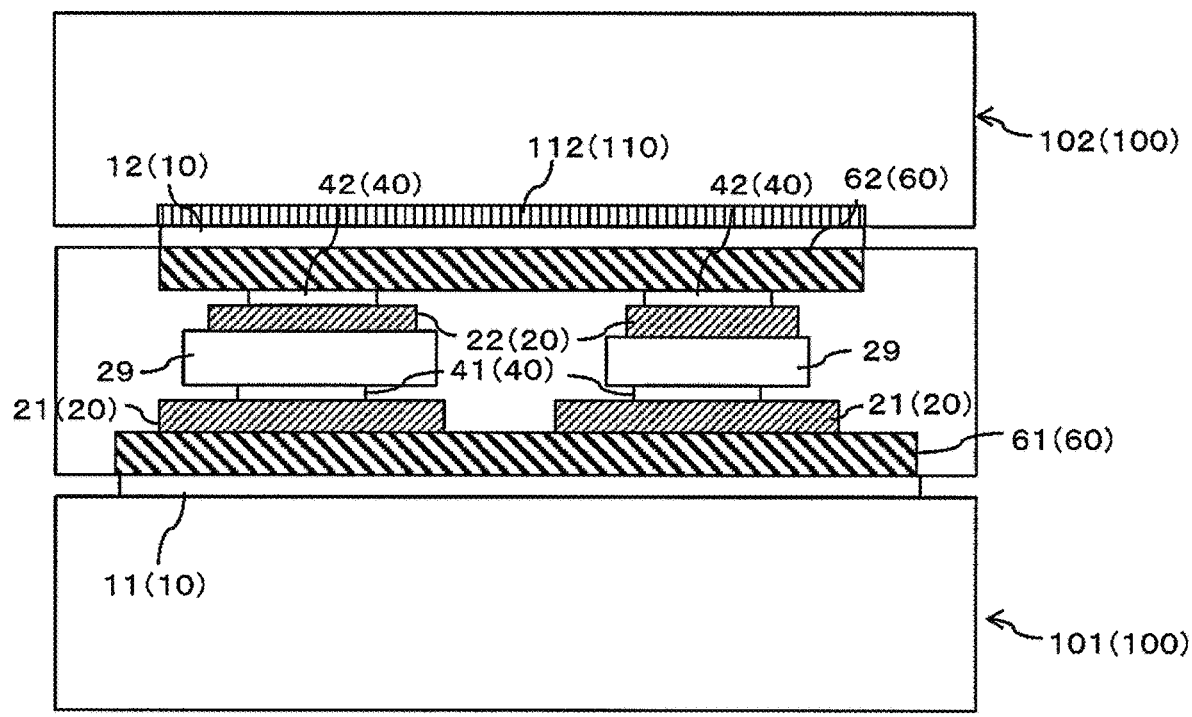
FIG. 14 is a vertical cross-sectional view showing an electronic device of a first variant of the third embodiment of the present invention.

In aspects shown in FIGS. 13 and 14, conductor poles 29 are provided on the one side (the upper side of FIGS. 13 and 14) of the first electronic elements 41, and the second conductor layers 22 are provided on one side (the upper side of FIGS. 13 and 14) of the conductor poles 29.

As described above, when the electronic elements 40 have a switching element, noise tends to increase. Hence, by adopting an aspect in which a divided part 110 is provided on a side provided with at least a switching element, the generation of noise originating from the switching element can be suppressed.

In addition, an aspect may be adopted in which a divided part 110 is provided regardless of whether the first electronic elements 41 and the second electronic elements 42 have a switching element. That is, regardless of whether the first electronic elements 41 have a switching element and regardless of whether the second electronic elements 42 have a switching element, only the first divided part 111 may be provided and the second divided part 112 may not be provided (see FIG. 13), or only the second divided part 112 may be provided and the first divided part 111 may not be provided (see FIG. 14), or both the first divided part 111 and the second divided part 112 may be provided (see FIG. 15). The divided parts 110 shown in FIGS. 13 to 15 may have a plurality of divided units 120 such as those shown in the first embodiment. That is, the first divided part 111 may have a plurality of first divided units, the second divided part 112 may have a plurality of second divided units, or the first divided part 111 may have a plurality of first divided units and the second divided part 112 may have a plurality of second divided units.

In addition, switching elements may be gathered on one side or the other side, and a divided part 110 may be provided on the side on which the switching elements are gathered. More specifically, when the first electronic elements 41 have a switching element and the second electronic elements 42 do not have a switching element, as shown in FIG. 13, only the first divided part 111 may be provided and the second divided part 112 may not be provided. In this case, a flat surface 150 abuts on the second heat dissipation layer 12. When the second electronic elements 42 have a switching element and the first electronic elements 41 do not have a switching element, as shown in FIG. 14, only the second divided part 112 may be provided and the first divided part 111 may not be provided. In this case, a flat surface 150 abuts on the first heat dissipation layer 11.

If importance is placed on heat dissipation performance, then switching elements may be gathered on one side or the other side, and a divided part 110 may not be provided on the side on which the switching elements are gathered. More specifically, when the first electronic elements 41 have a switching element and the second electronic elements 42 do not have a switching element, as shown in FIG. 14, only the second divided part 112 may be provided and the first divided part 111 may not be provided. In this case, a flat surface 150 abuts on the first heat dissipation layer 11. When the second electronic elements 42 have a switching element and the first electronic elements 41 do not have a switching element, as shown in FIG. 13, only the first divided part 111 may be provided and the second divided part 112 may not be provided. In this case, a flat surface 150 abuts on the second heat dissipation layer 12.

Figure 15:
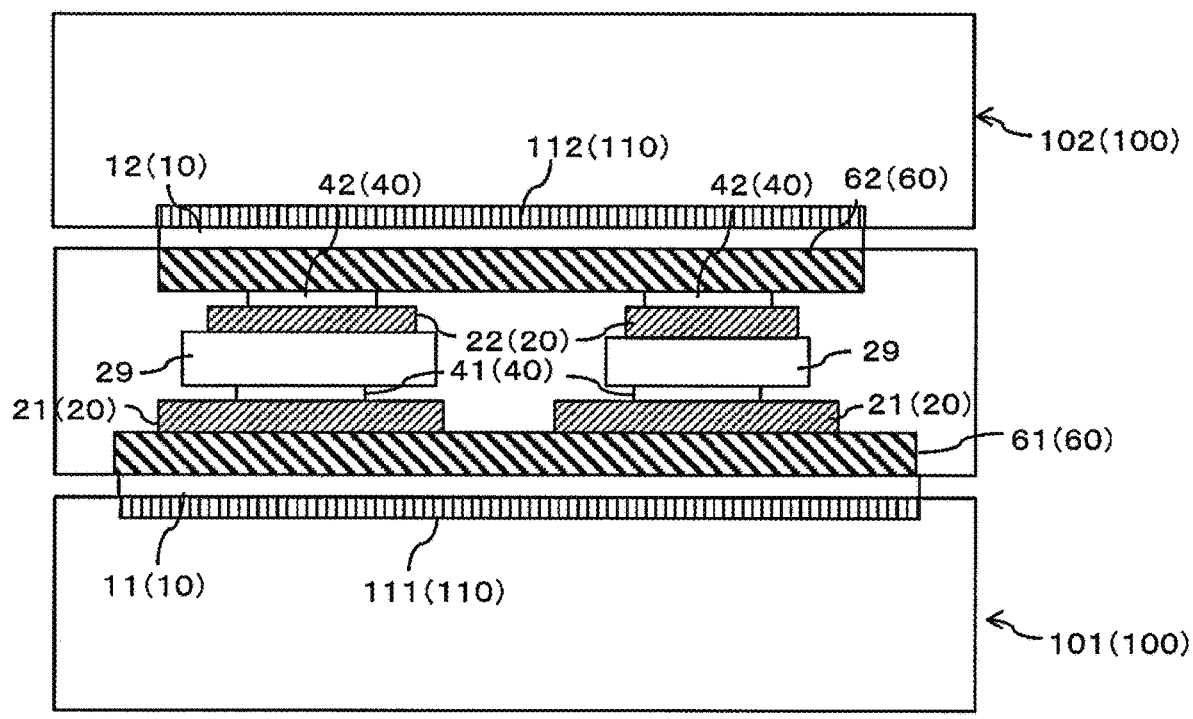
FIG. 15 is a vertical cross-sectional view showing an electronic device of a second variant of the third embodiment of the present invention.
Figure 16:
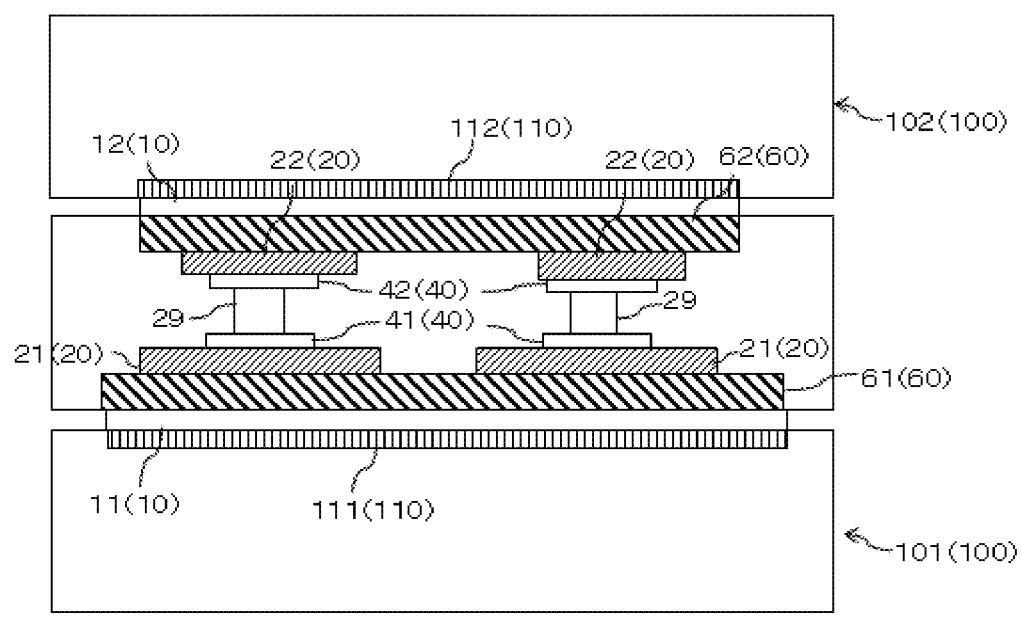
FIG. 16 is a vertical cross-sectional view showing an electronic device of a third variant of the third embodiment of the present invention.

Note that unlike the aspects shown in FIGS. 13 to 15, as shown in FIG. 16, first electronic elements 41 may be provided on one side of first conductor layers 21, conductor poles 29 may be provided on one side of the first electronic elements 41, second electronic elements 42 may be provided on one side of the conductor poles 29, and second conductor layers 22 may be provided on one side of the second electronic elements 42.

In the present embodiment, various configurations (including variants) that are described in the first and second embodiments can be adopted.

The above-described description of the embodiments, description of the variants, and disclosure of the drawings are merely an example for describing the inventions recited in the claims, and the inventions recited in the claims are not limited by the above-described description of the embodiments, description of the variants, and disclosure of the drawings. In addition, a claim recitation made at the time of filing of this application is merely an example, and the claim recitation can also be changed as appropriate based on the description of the specification, drawings, etc.

REFERENCE SIGNS LIST

10 HEAT DISSIPATION LAYER
11 FIRST HEAT DISSIPATION LAYER
12 SECOND HEAT DISSIPATION LAYER
20 CONDUCTOR LAYER
40 ELECTRONIC ELEMENT
41 FIRST ELECTRONIC ELEMENT
42 SECOND ELECTRONIC ELEMENT
60 INSULATING SUBSTRATE
61 FIRST INSULATING SUBSTRATE
62 SECOND INSULATING SUBSTRATE
100 COOLING BODY
110 DIVIDED PART
115 ABUTTING PART
116 GROOVE PART
120 DIVIDED UNIT

The invention claimed is:
1. An electronic device comprising:
an insulating substrate;
a plurality of conductor layers provided on a first major surface of the insulating substrate;
a plurality of electronic elements provided on the plurality of conductor layers respectively;
a heat dissipation plate provided on a second major surface opposite the first major surface of the insulating substrate; and
a cooling body in contact with the heat dissipation plate;
wherein the cooling body is divided on a surface, which contacts with the heat dissipation plate, to a plurality of areas corresponding to the plurality of electronic elements; and
wherein a plurality of groove parts are formed at the plurality of areas respectively.
2. The electronic device according to claim 1, wherein the plurality of areas in the cooling body are provided to overlap the plurality of electronic elements in plan view respectively.
3. The electronic device according to claim 1, wherein each of the plurality of areas in the cooling body is a grid shape formed by the plurality of groove parts.
4. The electronic device according to claim 1,
wherein a cooling fluid is capable of flowing on the plurality of groove parts.
5. The electronic module according to claim 1,
wherein a lubricant is provided on the plurality of groove parts.

* * * * *